(12) United States Patent
Vega et al.

(10) Patent No.: US 11,916,014 B2
(45) Date of Patent: Feb. 27, 2024

(54) GATE CONTACT INSIDE GATE CUT TRENCH

(71) Applicant: INTERNATIONAL BUSINESS MACHINES CORPORATION, Armonk, NY (US)

(72) Inventors: Reinaldo Vega, Mahopac, NY (US); Takashi Ando, Eastchester, NY (US); Cheng Chi, Jersey City, NJ (US); Praneet Adusumilli, Somerset, NJ (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 203 days.

(21) Appl. No.: 17/482,874

(22) Filed: Sep. 23, 2021

(65) Prior Publication Data

US 2023/0093462 A1 Mar. 23, 2023

(51) Int. Cl.
*H01L 23/522* (2006.01)
*H01L 23/528* (2006.01)
*H01L 27/092* (2006.01)

(52) U.S. Cl.
CPC ...... *H01L 23/5226* (2013.01); *H01L 23/5286* (2013.01); *H01L 27/092* (2013.01); *H01L 27/0924* (2013.01)

(58) Field of Classification Search
CPC ............. H01L 23/5226; H01L 23/5286; H01L 27/092; H01L 27/0924
USPC .......................................................... 257/59
See application file for complete search history.

(56) References Cited

U.S. PATENT DOCUMENTS

| | | | |
|---|---|---|---|
| 9,379,027 B2 | 6/2016 | Kim | |
| 9,679,985 B1 | 6/2017 | Wu et al. | |
| 9,853,110 B2 | 12/2017 | Zhang et al. | |
| 10,224,246 B2 | 3/2019 | Cheng et al. | |
| 10,236,213 B1 | 3/2019 | Pandey et al. | |
| 10,297,452 B2 | 5/2019 | Xie et al. | |
| 10,573,724 B2 | 2/2020 | Cheng | |
| 2017/0278752 A1 | 9/2017 | Ryckaert et al. | |
| 2018/0108676 A1* | 4/2018 | Cheng | G02F 1/1362 |
| 2018/0350810 A1 | 12/2018 | Bergendahl et al. | |
| 2019/0378900 A1 | 12/2019 | Xie et al. | |

* cited by examiner

Primary Examiner — Tu-Tu V Ho
(74) Attorney, Agent, or Firm — Samuel Waldbaum; Tutunjian & Bitetto, P.C.

(57) ABSTRACT

A field effect device is provided. The field effect device includes an active gate structure, a gate contact within the active gate structure, wherein the gate contact is the same height as the active gate structure, and a gate cut dielectric on opposite sides of the gate contact and active gate structure.

20 Claims, 7 Drawing Sheets

GATE CONTACT INSIDE GATE CUT TRENCH

BACKGROUND

The present invention generally relates to a gate contact within a gate-cut trench, and more particularly to an enlarged gate contact area using a full height gate contact within a gate-cut trench.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and fin FETs have been formed with the channel extending outward from the substrate. Depending on the doping of the source and drain, an n-FET or a p-FET can be formed.

SUMMARY

In accordance with an embodiment of the present invention, a field effect device is provided. The field effect device includes an active gate structure, a gate contact within the active gate structure, wherein the gate contact is the same height as the active gate structure, and a gate cut dielectric on opposite sides of the gate contact and active gate structure.

In accordance with another embodiment of the present invention, a field effect device is provided. The field effect device includes at least one active semiconductor region, and a source/drain on each of the at least one active semiconductor regions. The field effect device further includes an active gate structure across the at least one active semiconductor regions, and a gate contact within the active gate structure, wherein the gate contact is the same height as the active gate structure. The field effect device further includes a gate cut dielectric at opposite ends of the active gate structure, and a dummy gate structure at each of opposite ends of the at least one active semiconductor regions.

In accordance with yet another embodiment of the present invention, a field effect device is provided. The field effect device includes at least one active semiconductor region, and a dielectric bottom spacer layer on a lower portion of the at least one active semiconductor region. The field effect device further includes a source/drain on each of the at least one active semiconductor regions, and a first source/drain contact on a first source/drain. The field effect device further includes a second source/drain contact on a second source/drain, and an active gate structure on the dielectric bottom spacer layer and across the at least one active semiconductor region. The field effect device further includes a gate contact within the active gate structure, wherein the gate contact is the same height as the active gate structure, a gate cut dielectric at opposite ends of the active gate structure, and a dummy gate structure at each of opposite ends of the at least one active semiconductor region.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a gate contact within a gate cut trench, wherein the gate contact can be in electrical contact over the full height of an active gate structure. The enlarged interface between the gate contact an the conductive portion of the active gate structure can reduce Schottky resistance between these two features. This reduced resistance can reduce gate response time.

Embodiments of the present invention provide a shared active gate structure over an n-type field effect transistor (nFET) and a p-type field effect transistor (pFET). The nFETs and pFETs can be, for example, fin field effect transistor (FinFET) devices or nanosheet field effect transistor (NSFET) devices. The shared gate structure can have a single gate contact.

In various embodiments, the gate cut can cut both the active and dummy gates.

In various embodiments, the gate contact can be connected to a gate line through a buried interconnect.

In various embodiments, a conductive slab can be formed in each of the gate cut trenches.

Exemplary applications/uses to which the present invention can be applied include, but are not limited to: complementary-metal-oxide-semiconductor (CMOS) logic devices.

It is to be understood that aspects of the present invention will be described in terms of a given illustrative architecture; however, other architectures, structures, substrate materials and process features and steps can be varied within the scope of aspects of the present invention.

Figure 1:
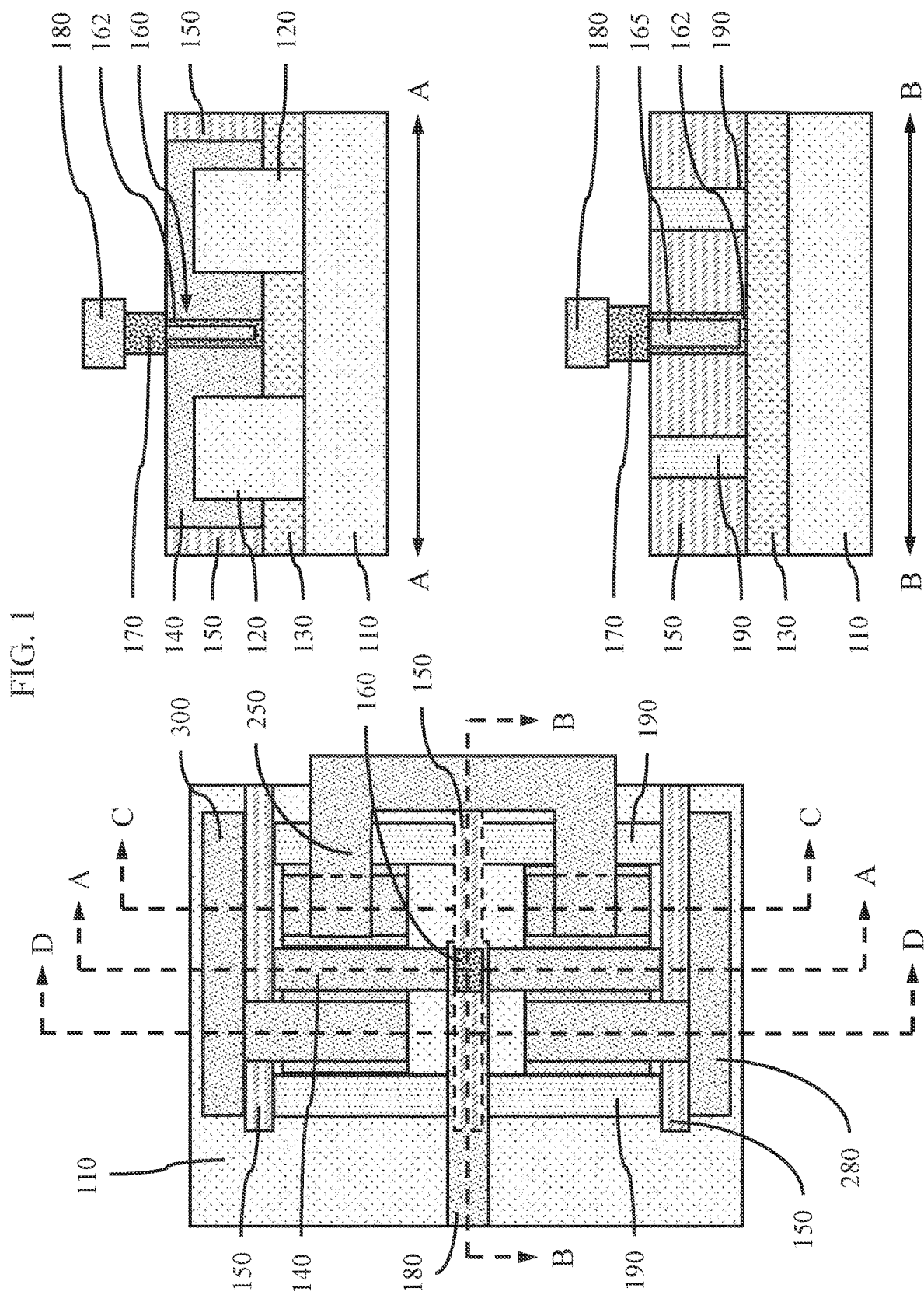
FIG. 1 is a top view with AA and BB cross-sectional views showing an embodiment of a semiconductor device, in accordance with an embodiment of the present invention.

Referring now to the drawings in which like numerals represent the same or similar elements and initially to FIG. 1, FIG. 1 is a top view with AA and BB cross-sectional views showing an embodiment of a semiconductor device, in accordance with an embodiment of the present invention.

The top view shows a two-transistor device, for example, a complementary metal-oxide-semiconductor (CMOS) device connected to power rails 280, 300 and a gate metal line 180.

The AA cross-section cuts through the active gate structure 140 along the long axis of the active gate structure over the active semiconductor region 120.

In one or more embodiments, a first active semiconductor region 120 can be formed on a first region of a substrate 110 and a second active semiconductor region 120 can be formed on a second region of the substrate 110. The active semiconductor region can include device channels, formed by, for example, vertical fins, nanosheets, and/or nanowires. A dielectric bottom spacer layer 130 can be formed on a lower portion of the active semiconductor region 120, and an active gate structure 140 can be formed on/across a central portion of the active semiconductor region 120, where the active gate structure 140 can be formed on the device channels. The active gate structure 140 can include a gate dielectric layer on the active semiconductor region 120, a work function material layer on the gate dielectric layer, and a conductive gate fill on the work function material layer. In one or more embodiments, a gate cut dielectric 150 made of an insulating, dielectric material can be formed at either end of the active gate structure 140 and through the middle of the active gate structure 140. Additional dummy gate structures 190 can be formed at opposite ends of the active semiconductor region 120 and laterally offset from the active gate structure 140.

In one or more embodiments, a gate-cut trench can be formed in the active gate structure 140, where the gate-cut trench can be parallel with the active semiconductor region 120 through the center of the gate structure between the two regions. A dielectric fill can be formed in the gate-cut trench, and an opening formed in the dielectric fill aligned with the conductive gate fill of the active gate structure 140. A conductive fill material can be deposited in the opening in the gate-cut trench to form a gate contact 160 within the gate-cut trench that is in electrical contact with the conductive gate fill of the active gate structure 140. The gate contact 160 can form an electrical contact to the full height of the conductive material of the active gate structure 140, where the gate contact 160 can extend from a top surface of conductive gate material of the active gate structure 140 at least down to a bottom surface of the conductive gate material. The gate contact 160 can be at least the same height as the active gate structure 140, or the gate contact 160 may extend into a bottom dielectric spacer 130, where the gate contact can extend through the full height of the active gate structure 140.

In various embodiments, the gate contact 160 can include multiple layers in the gate-cut opening, where a first conductive layer 162 can be in direct contact with the conductive material of the active gate structure 140, and a second conductive material 165 can fill in the opening, for example, as in a dual damascene process. The first conductive layer 162 can be multi-layered, and can further include a barrier layer and/or a seed layer. The gate contact 160 including the first conductive layer 162 can be a different conductive material from that of the conductive gate fill of the active gate structure 140.

In various embodiments, the first conductive layer 162 can be a metal, including, but not limited to, tantalum (Ta), molybdenum (Mo), manganese (Mn), a metal compound, including, but not limited to, tantalum nitride (TaN), tantalum carbide (TaC), titanium nitride (TiN), titanium carbide (TiC), tungsten carbide (WC), and combinations thereof.

In various embodiments, the second conductive material 165 can be a metal, including, but not limited to, copper (Cu), tungsten (W), cobalt (Co), molybdenum (Mo), platinum (Pt), and combinations thereof. The second conductive material 165 can be a different conductive material from the first conductive layer 162 and/or the conductive gate fill.

An conductive stud 170 can be formed on the gate contact 160 to connect the gate contact 160 with a gate metal line 180. The conductive stud 170 can be a metal, including, but not limited to, copper (Cu), tungsten (W), cobalt (Co), molybdenum (Mo), platinum (Pt), and combinations thereof. The gate metal line 180 can be a metal, including, but not limited to, copper (Cu), tungsten (W), cobalt (Co), molybdenum (Mo), platinum (Pt), and combinations thereof.

The BB cross-section cuts through the active gate structure 140 parallel to a long axis of the active semiconductor regions 120, and between the first region and the second region.

In one or more embodiments, the gate-cut trench and gate cut dielectric 150 extends through the active gate structure 140 and the dummy gate structures 190 on opposite sides of the active gate structure 140. The gate contact 160, including a first conductive layer 162 and a second conductive material 165, can extend through the full height of the gate cut dielectric 150.

The conductive stud 170 can be formed on the top of the gate cut dielectric 150, and the gate metal line 180 can be formed on the conductive stud 170.

In various embodiments, the dummy gate structures 190 can be the same material and structure as the active gate structure 140, but without electrical connections to the conductive gate materials, thereby rendering the dummy gate structures 190 an electrically inert gate structure.

Figure 2:
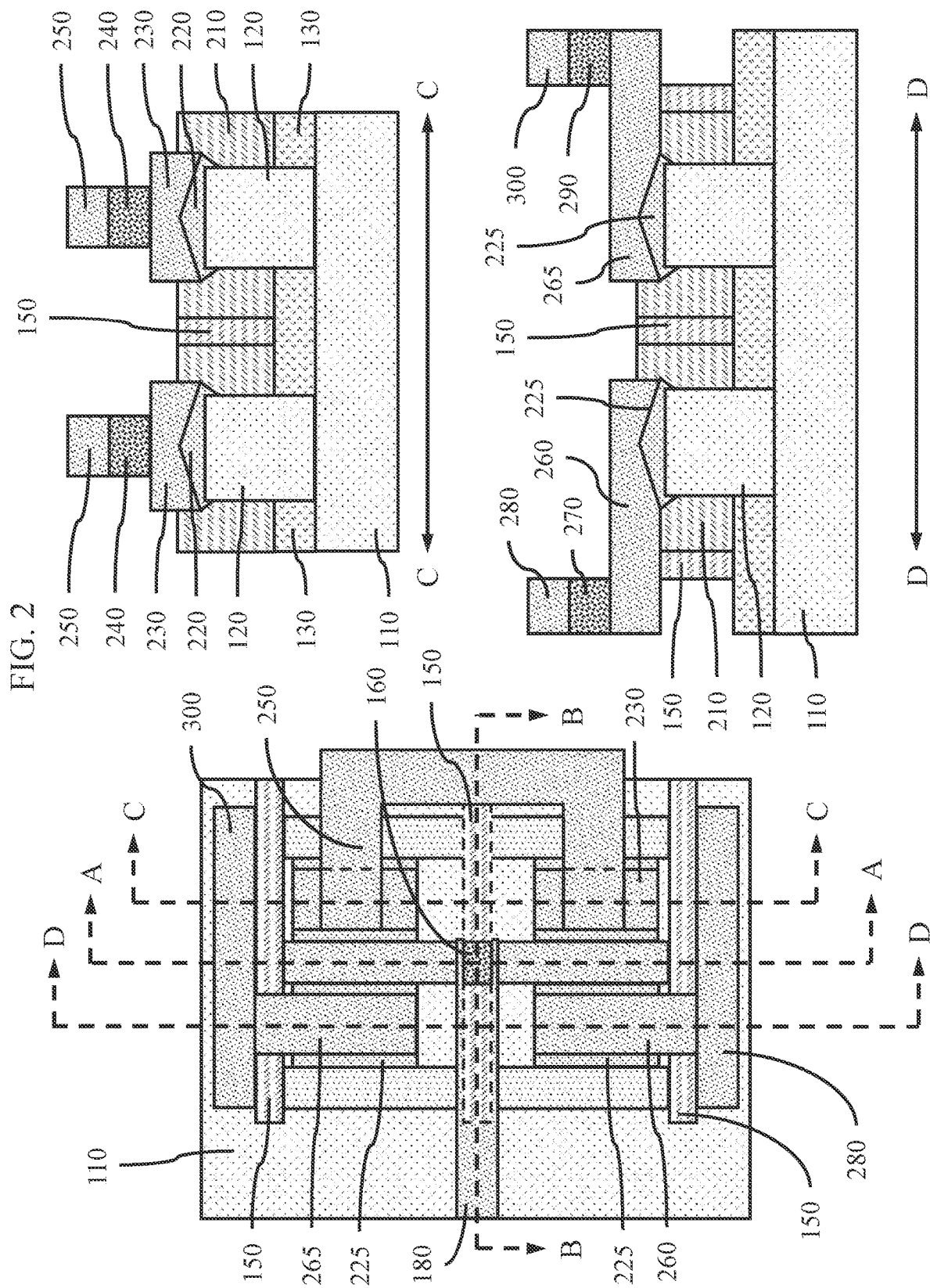
FIG. 2 is a top view with CC and DD cross-sectional views showing an embodiment of a semiconductor device, in accordance with an embodiment of the present invention.

FIG. 2 is a top view with CC and DD cross-sectional views showing an embodiment of a semiconductor device, in accordance with an embodiment of the present invention The CC cross-section cuts through the active semiconductor region 120 and source/drain 220 on a first side of the active gate structure 140, where the gate cut dielectric 150 is between the two active semiconductor regions 120.

In various embodiments, first source/drain 220 can be formed on the active semiconductor region 120, where the first source/drains 220 can be formed by an epitaxial growth process and doping. The first source/drain 220 can be formed on a device channel formed by, for example, vertical fins, nanosheets, or nanowires. An interlayer dielectric (ILD) layer 210 can be formed on the bottom dielectric spacer 130, active semiconductor region 120, gate cut dielectric 150, and first source/drain 220.

In various embodiments, a first source/drain contact 230 can be formed on the first source/drain 220, where the source/drain contact can include a metal and a metal silicide to reduce contact resistance with the first source/drain 220. The first source/drains 220 and first source/drain contacts 230 can be on a first side of the active gate structure 140.

In various embodiments, a source/drain stud 240 can be formed on each of the first source/drain contacts 230, and a source/drain line 250 can be formed on the source/drain studs 240, where the source/drain line 250 can electrically connect the first source/drain(s) 220 on a first active semiconductor region 120 with the first source/drain(s) 220 on a second active semiconductor region 120.

The DD cross-section cuts through the active semiconductor regions 120 and source/drains 225 on a second side of the active gate structure 140, where the gate cut dielectric 150 is between the two active semiconductor regions 120. The gate cut dielectric 150 can extend down to a top surface of a bottom dielectric spacer 130.

In various embodiments, second source/drain 225 can be formed on the active semiconductor region 120, where the second source/drain 225 can be formed by an epitaxial growth process and doping. An interlayer dielectric (ILD) layer 210 can be formed on the bottom dielectric spacer 130, active semiconductor region 120, gate cut dielectric 150, and second source/drains 225.

In various embodiments, a second source/drain contact 260 can be formed on the second source/drain(s) 225, where the source/drain contact 260 can include a metal and a metal silicide to reduce contact resistance with the second source/drain(s) 225. The second source/drain(s) 225 and second source/drain contacts 260 can be on a second side of the active gate structure 140 opposite the first side.

In various embodiments, a first power rail stud 270 can be formed on one of the first source/drain contact 260, and a second power rail stud 290 can be formed on the other source/drain contact 265, where the first power rail stud 270 can electrically connect the second source/drain 225 on a first active semiconductor region 120 with a first voltage power rail 280, and the second power rail stud 290 can electrically connect the second source/drains 225 on a second active semiconductor region 120 with a second voltage power rail 300. The first voltage power rail 280 may be connected to an electrical ground, and the second voltage power rail 300 may be connected to a voltage source.

Figure 3:
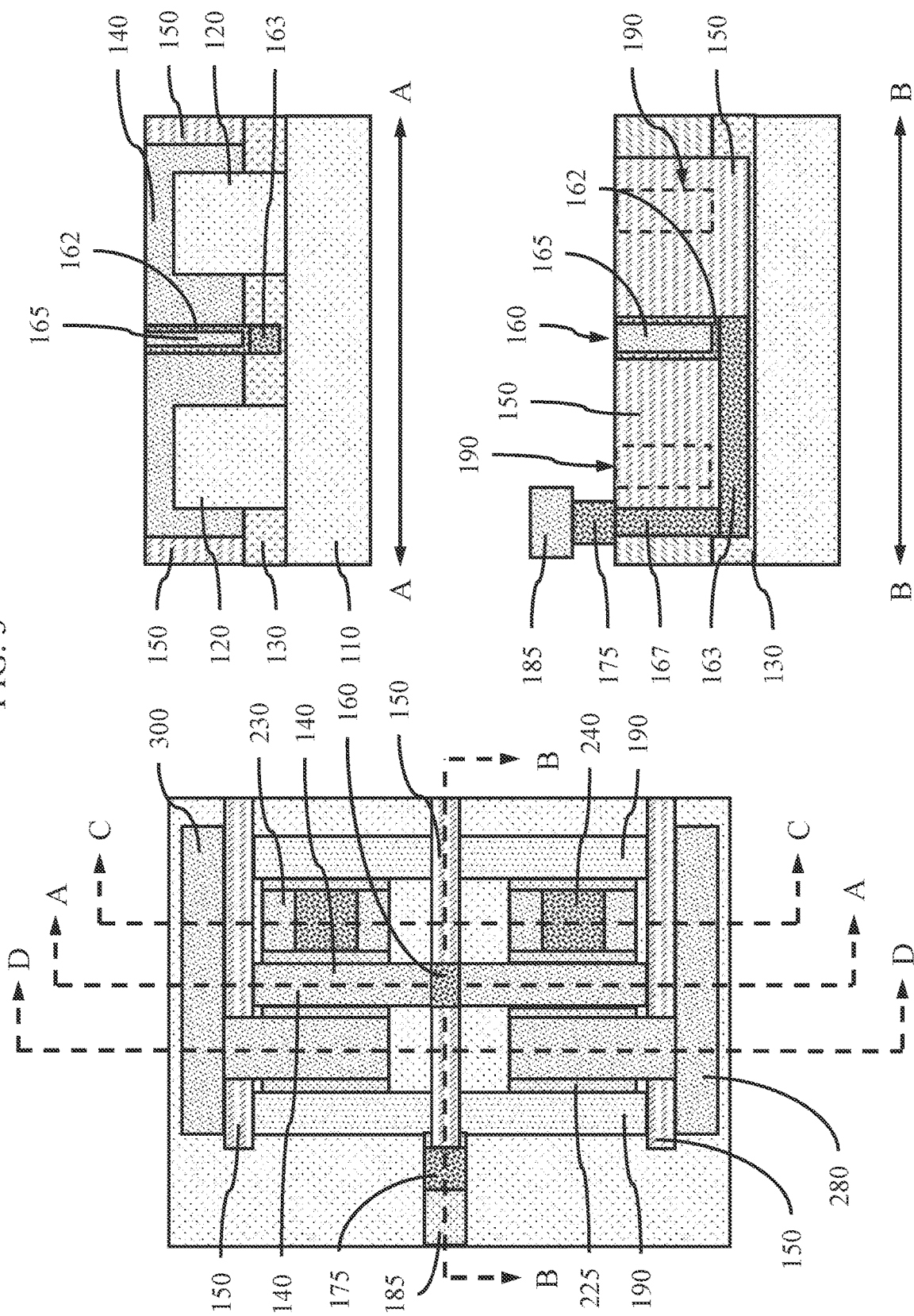
FIG. 3 is a top view with AA and BB cross-sectional views showing another embodiment of a semiconductor device, in accordance with an embodiment of the present invention.

FIG. 3 is a top view with AA and BB cross-sectional views showing another embodiment of a semiconductor device, in accordance with an embodiment of the present invention.

The top view shows a two-transistor device, for example, a complementary metal-oxide-semiconductor (CMOS) device connected to power rails 280, 300 and an offset gate metal line 185. In various embodiments the offset gate metal line 185 can be electrically connected to the gate contact 160 through an offset stud 175, gate interconnect via 167, and buried interconnect 163.

The AA cross-section cuts through the active gate structure 140 along the long axis of the active gate structure over the active semiconductor region 120.

In one or more embodiments, a first active semiconductor region 120 can be formed on a first region of a substrate 110 and a second active semiconductor region 120 can be formed on a second region of the substrate 110. A dielectric bottom spacer layer 130 can be formed on a lower portion of the active semiconductor region 120, and an active gate structure 140 can be formed on/across at least a portion of the active semiconductor region 120. The active gate structure 140 can include a gate dielectric layer on the active semiconductor region 120, a work function material layer on the gate dielectric layer, and a conductive gate fill on the work function material layer. In one or more embodiments, a gate cut dielectric 150 can be formed at either end of the active gate structure 140 and through the middle of the active gate structure 140. Additional dummy gate structures 190 can be formed at opposite ends of the active semiconductor region 120 and laterally offset from the active gate structure 140.

In one or more embodiments, a gate-cut trench can be formed in the active gate structure 140 and into the dielectric bottom spacer layer 130, where the gate-cut trench can be parallel with the active semiconductor region 120 through the center of the gate structure between the two regions. A buried interconnect 163 can be formed at the bottom of the gate cut trench below the bottom surface of the active gate structure 140 and/or below a top surface of the bottom spacer layer 130, so the buried interconnect can be between a bottom surface of the active gate structure 140 and a bottom surface of the gate cut dielectric 150. A dielectric fill can be formed in the gate-cut trench, and an opening formed in the dielectric fill aligned with the conductive gate fill of the active gate structure 140. A conductive fill material can be deposited in the opening in the gate-cut trench to form a gate contact 160 within the gate-cut trench that is in electrical contact with the conductive gate fill of the active gate structure 140. The gate contact 160 can form an electrical contact to the conductive material of the active gate structure 140 and to the buried interconnect 163, where the gate contact 160 can form an electrical contact to the full height of the conductive material of the active gate structure 140.

The BB cross-section cuts through the active gate structure 140 parallel to the active semiconductor region 120 between the first region and the second region.

In one or more embodiments, the gate-cut trench and gate cut dielectric 150 extends through the active gate structure 140 and the dummy gate structures 190 on opposite sides of the active gate structure 140. The gate contact 160, including a first conductive layer 162 and a second conductive material 165 can be formed in the gate cut dielectric 150. The gate contact 160 and an underlying buried interconnect 163 can extend through the full height of the gate cut dielectric 150.

In various embodiments, a gate interconnect via 167 can be formed in the gate cut dielectric 150 a distance from the gate contact 160, where the gate interconnect via 167 can be adjacent to a dummy gate structure 190. An offset stud 175 can be formed on the top of the gate cut dielectric 150, and the offset gate metal line 185 can be formed on the offset stud 175. The offset stud 175 can be located laterally beyond one of the dummy gate structures 190 adjacent to the active gate structure 140.

In various embodiments, the gate interconnect via 167 and buried interconnect 163 can be a metal, including, but not limited to, copper (Cu), tungsten (W), cobalt (Co), molybdenum (Mo), platinum (Pt), and combinations thereof.

Figure 4:
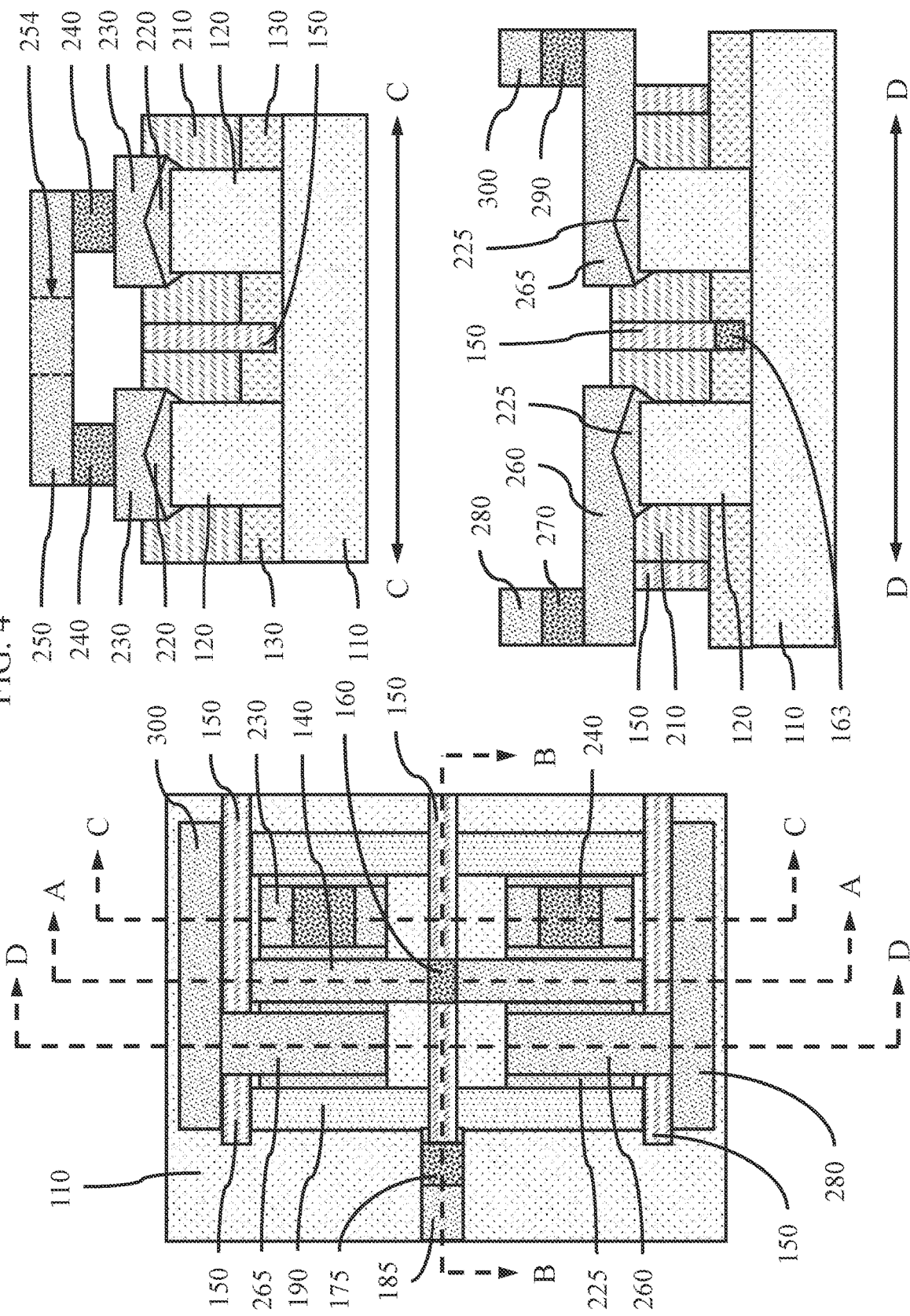
FIG. 4 is a top view with CC and DD cross-sectional views showing another embodiment of a semiconductor device, in accordance with an embodiment of the present invention.

FIG. 4 is a top view with CC and DD cross-sectional views showing another embodiment of a semiconductor device, in accordance with an embodiment of the present invention.

The CC cross-section cuts through the active semiconductor regions 120 and source/drains 220 on a first side of the active gate structure 140, where the gate cut dielectric 150 is between the two sets of the active semiconductor regions 120.

In various embodiments, the gate cut trench and the gate cut dielectric 150 can extend down into the bottom dielectric spacer 130, where a portion of the bottom dielectric spacer 130 can be between the gate cut dielectric 150 and the substrate 110.

In various embodiments, first source/drains 220 can be formed on the active semiconductor regions 120, where the first source/drains 220 can be formed by an epitaxial growth process and doping. An interlayer dielectric (ILD) layer 210 can be formed on the bottom dielectric spacer 130, active semiconductor regions 120, gate cut dielectric 150, and first source/drains 220.

In various embodiments, a source/drain stud 240 can be formed on each of the first source/drain contacts 230, and a source/drain line 250 can be formed on the source/drain studs 240, where the source/drain line 250 can electrically connect the first source/drains 220 on a first active semiconductor region 120 with the first source/drains 220 on a second active semiconductor region 120.

In various embodiments, a portion of the source/drain line 250 can extend linearly between the two source/drain studs 240, and another portion 254 of the source/drain line 250 can extend perpendicularly from the portion of the source/drain line 250 between the two source/drain studs 240.

The DD cross-section cuts through the active semiconductor region 120 and source/drains 225 on a second side of the active gate structure 140, where the gate cut dielectric 150 is between the two active semiconductor regions 120.

In various embodiments, the buried interconnect 163 can be located between the top surface and the bottom surface of the bottom dielectric spacer 130. The gate cut dielectric 150 can cover the buried interconnect 163 between the gate contact 160 and the gate interconnect via 167, and the portion of the bottom dielectric spacer 130 can electrically insulate the buried interconnect 163 from the substrate 110.

In various embodiments, second source/drains 225 can be formed on the active semiconductor regions 120, where the second source/drain 225 can be formed by an epitaxial growth process and doping. An interlayer dielectric (ILD) layer 210 can be formed on the bottom dielectric spacer 130, active semiconductor region 120, gate cut dielectric 150, and second source/drains 225.

In various embodiments, a second source/drain contact 260 can be formed on each of the second source/drains 225, where the source/drain contact 260 can include a metal and a metal silicide to reduce contact resistance with the second source/drains 225. The second source/drains 225 and second source/drain contacts 260 can be on a second side of the active gate structure 140 opposite the first side.

In various embodiments, a first power rail stud 270 can be formed on the second source/drain contact 260, and a second power rail stud 290 can be formed on the other source/drain contact 265, where the first power rail stud 270 can electrically connect the second source/drains 225 on a first active semiconductor region 120 with a first voltage power rail 280, and the second power rail stud 290 can electrically connect the second source/drains 225 on a second active semiconductor region 120 with a second voltage power rail 300. The first voltage power rail 280 and second voltage power rail 300 can be a greater distance away from the active gate structure 140 than the gate cut dielectrics 150.

Figure 5:
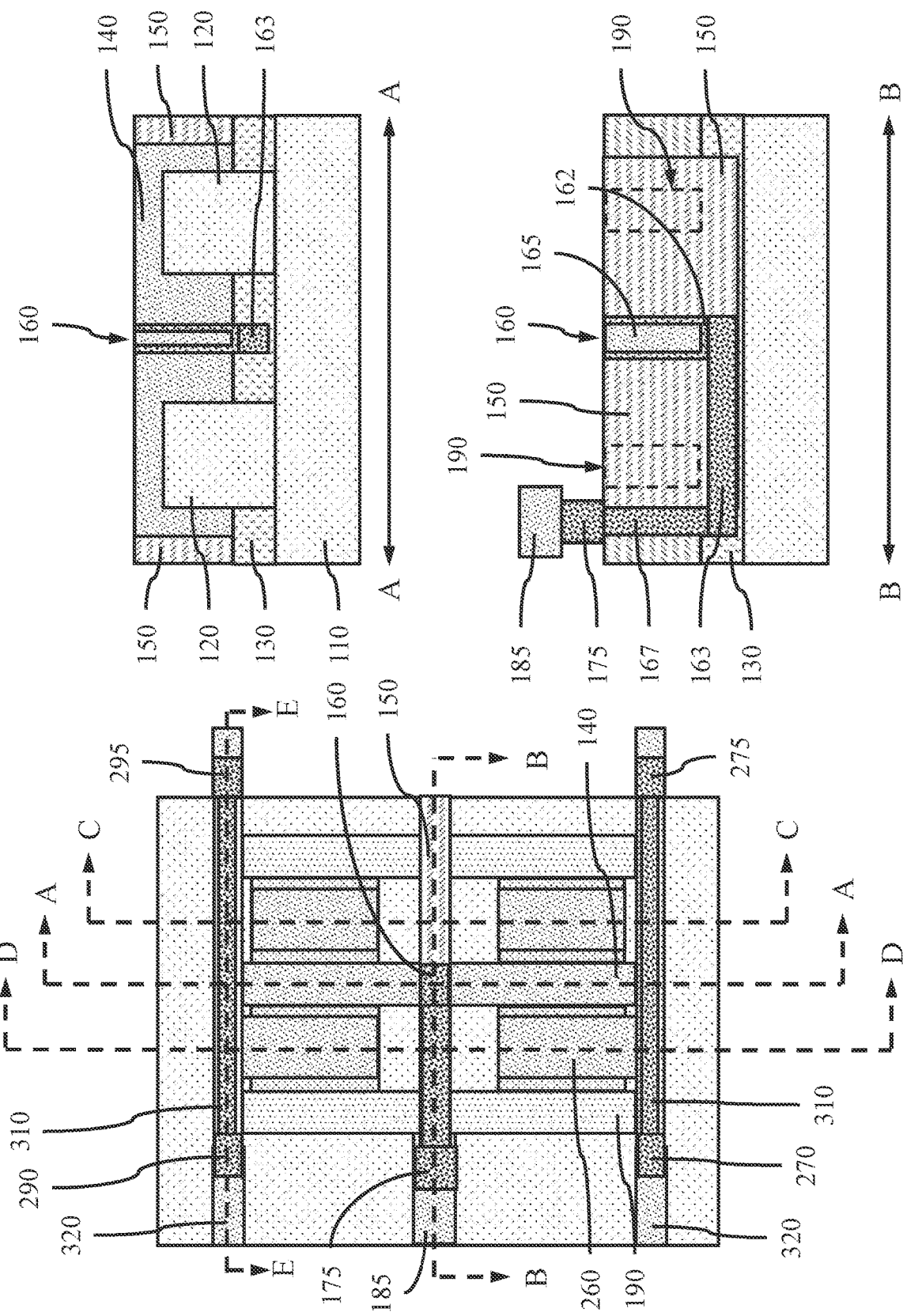
FIG. 5 is a top view with AA and BB cross-sectional views showing yet another embodiment of a semiconductor device, in accordance with an embodiment of the present invention.

FIG. 5 is a top view with AA and BB cross-sectional views showing yet another embodiment of a semiconductor device, in accordance with an embodiment of the present invention.

The top view shows a two-transistor device, for example, a complementary metal-oxide-semiconductor (CMOS) device connected to power rails 280, 300 and an offset gate metal line 185. In various embodiments the offset gate metal line 185 can be electrically connected to the gate contact 160 through an offset stud 175, gate interconnect via 167, and buried interconnect 163.

The AA cross-section cuts through the active gate structure 140 along the long axis of the active gate structure over the active semiconductor region 120.

In one or more embodiments, a first active semiconductor region 120 can be formed on a first region of a substrate 110 and a second active semiconductor region 120 can be formed on a second region of the substrate 110. A dielectric bottom spacer layer 130 can be formed on a lower portion of the active semiconductor region 120, and an active gate structure 140 can be formed on/across a central portion of the active semiconductor regions 120. The active gate structure 140 can include a gate dielectric layer on the active semiconductor region 120, a work function material layer on the gate dielectric layer, and a conductive gate fill on the work function material layer. In one or more embodiments, a gate cut dielectric 150 can be formed at either end of the active gate structure 140 and through the middle of the active gate structure 140. Additional dummy gate structures 190 can be formed at opposite ends of the active semiconductor region 120 and laterally offset from the active gate structure 140.

In one or more embodiments, a gate-cut trench can be formed in the active gate structure 140, and into the dielectric bottom spacer layer 130, where the gate-cut trench can be parallel with the active semiconductor region 120 through the center of the gate structure between the two regions. A buried interconnect 163 can be formed at the bottom of the gate cut trench below the top surface of the bottom spacer layer 130. A dielectric fill can be formed in the gate-cut trench to form the gate cut dielectric 150, and an opening formed in the gate cut dielectric 150 aligned with the conductive gate fill of the active gate structure 140. A conductive fill material can be deposited in the opening in the gate-cut trench to form a gate contact 160 within the gate-cut trench that is in electrical contact with the conductive gate fill of the active gate structure 140. The gate contact 160 can form an electrical contact to the conductive material of the active gate structure 140 and to the buried interconnect 163, where the gate contact 160 can form an electrical contact to the full height of the conductive material of the active gate structure 140.

The BB cross-section cuts through the active gate structure 140 parallel to the active semiconductor region 120 between the first region and the second region.

In one or more embodiments, the gate-cut trench and gate cut dielectric 150 extends through the active gate structure 140 and the dummy gate structures 190 on opposite sides of the active gate structure 140. The gate contact 160, including a first conductive layer 162 and a second conductive material 165 can be formed in the gate cut dielectric 150. The gate contact 160 and an underlying buried interconnect 163 can extend through the full height of the gate cut dielectric 150.

In various embodiments, a gate interconnect via 167 can be formed in the gate cut dielectric 150 a distance from the gate contact 160, where the gate interconnect via 167 can be adjacent to a dummy gate structure 190. An offset stud 175 can be formed on the top of the gate cut dielectric 150, and the offset gate metal line 185 can be formed on the offset stud 175. The offset stud 175 can be located laterally beyond one of the dummy gate structures 190 adjacent to the active gate structure 140. The offset stud 175 and offset gate metal line 185 can be conductive materials, for example, metals.

In one or more embodiments, a conductive slab 310 can be formed in each of the gate cut dielectrics 150 at opposite ends of the gate structure that are parallel with the active semiconductor regions 120. Forming the conductive slab 310 can be formed in each of the gate cut dielectrics 150 allows the overall footprint to be reduced by moving the electrical connections to the first source/drains 220 and the second source/drains 225 inward towards the active gate structure 140 and active semiconductor region 120.

Figure 6:
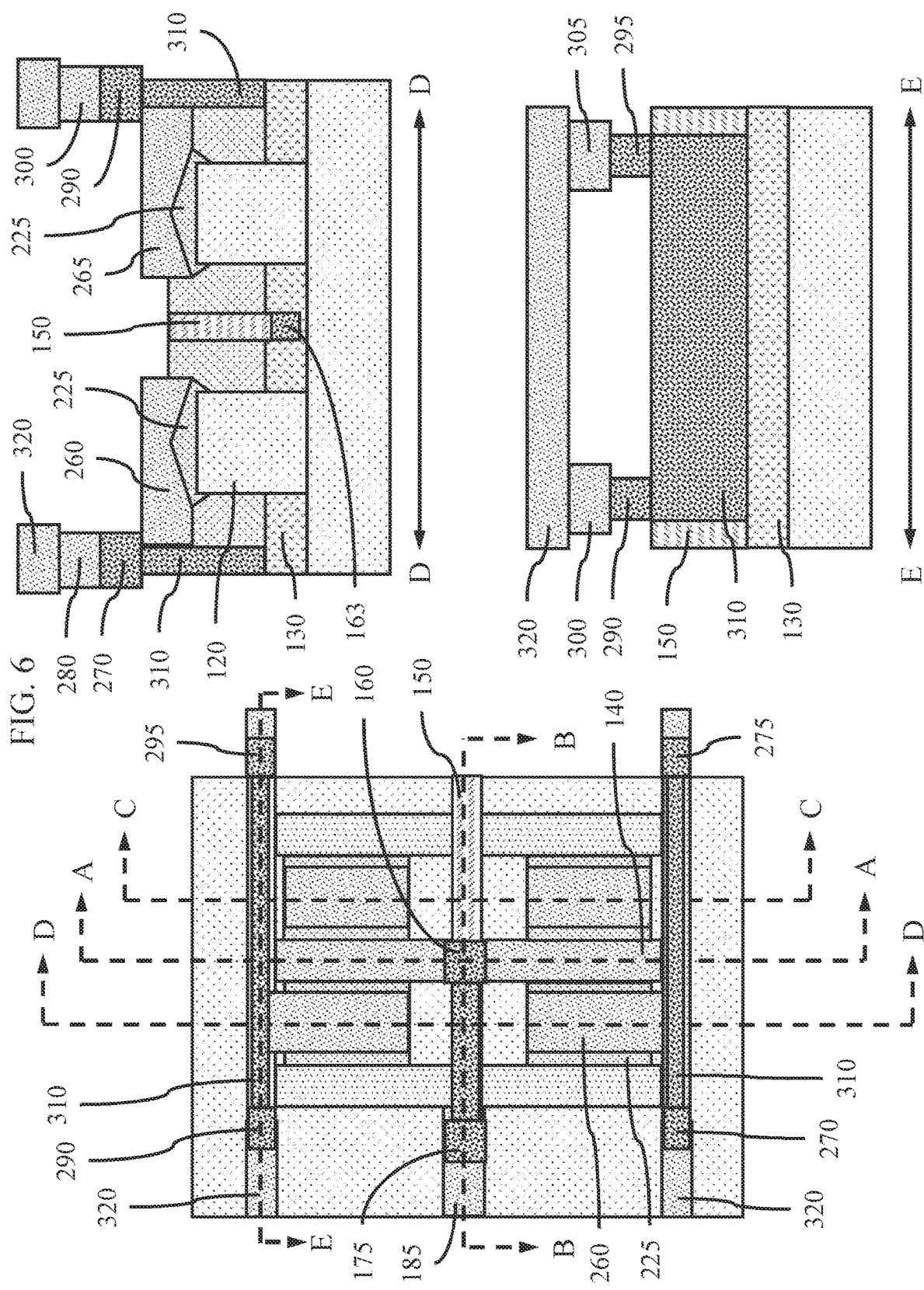
FIG. 6 is a top view with DD and EE cross-sectional views showing yet another embodiment of a semiconductor device, in accordance with an embodiment of the present invention.

FIG. 6 is a top view with DD and EE cross-sectional views showing yet another embodiment of a semiconductor device, in accordance with an embodiment of the present invention.

The DD cross-section cuts through the active semiconductor regions 120 and source/drains 225 on a second side of the active gate structure 140, where the gate cut dielectric 150 is between the two active semiconductor regions 120.

In various embodiments, the buried interconnect 163 can be located between the top surface and the bottom surface of the bottom dielectric spacer 130. The gate cut dielectric 150 can cover the buried interconnect 163 between the gate contact 160 and the gate interconnect via 167, and the portion of the bottom dielectric spacer 130 can electrically insulate the buried interconnect 163 from the substrate 110.

In various embodiments, second source/drain 225 can be formed on the active semiconductor region 120, where the second source/drain 225 can be formed by an epitaxial growth process and doping. An interlayer dielectric (ILD) layer 210 can be formed on the bottom dielectric spacer 130, active semiconductor region 120, gate cut dielectric 150, and second source/drain 225.

In various embodiments, a second source/drain contact 260 can be formed on each set of second source/drains 225, where the source/drain contact 260 can include a metal and a metal silicide to reduce contact resistance with the second source/drain 225. The second source/drains 225 and second source/drain contacts 260 can be on a second side of the active gate structure 140 opposite the first side.

In one or more embodiments, a conductive slab 310 can be formed in each of the gate cut dielectrics 150 at opposite ends of the active gate structure 140, that are parallel with the active semiconductor regions 120. Forming the conductive slabs 310 in each of the gate cut dielectrics 150 allows the overall footprint to be reduced by moving the electrical connections to the first source/drains 220 and the second source/drains 225 inward towards the active gate structure 140 and active semiconductor region 120.

In various embodiments, a second source/drain contact 260 can be formed to the conductive slab 310, and the first power rail stud 270 can be formed on the conductive slab 310. A source/drain contact 265 can be formed to the conductive slab 310, and the second power rail stud 290 can be formed on the other conductive slab 310, where the first power rail stud 270 can electrically connect the second source/drains 225 on a first active semiconductor region 120 with a first voltage power rail 280, and the second power rail stud 290 can electrically connect the second source/drains 225 on a second active semiconductor region 120 with a second voltage power rail 300. The first voltage power rail 280 and second voltage power rail 300 can be a greater distance away from the active gate structure 140 than the gate cut dielectrics 150. In various embodiments, a third power rail stud 295 and a third power rail 305 can be formed on the conductive slab 310.

In various embodiments, the power rails 320 can be in the first metal interconnect level. The power rails 280, 300 can be in the first via level. The first power rail stud 270 and second power rail stud 290 can be in the CB layer.

The EE cross-section cuts through the conductive slab 310 and gate cut dielectrics 150 at opposite ends of the active gate structure 140, where the conductive slab 310 is within the gate cut dielectric 150.

In one or more embodiments, a conductive slab 310 can be formed in each of the gate cut dielectrics 150 by forming a gate cut trench, filling the gate cut trench with a dielectric material, removing a portion of the dielectric material to form a slab space, and filling the slab space with a conductive material, for example, a metal.

Figure 7:
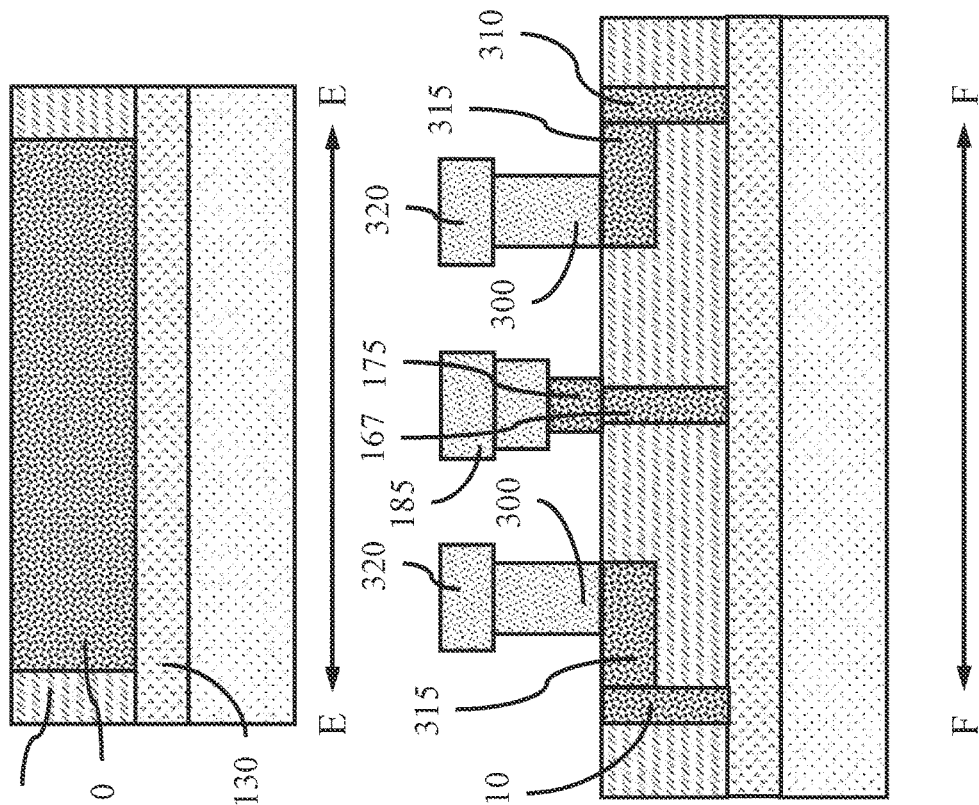
FIG. 7 is a top view with EE and FF cross-sectional views showing yet another embodiment of a semiconductor device, in accordance with an embodiment of the present invention.
Figure 7:
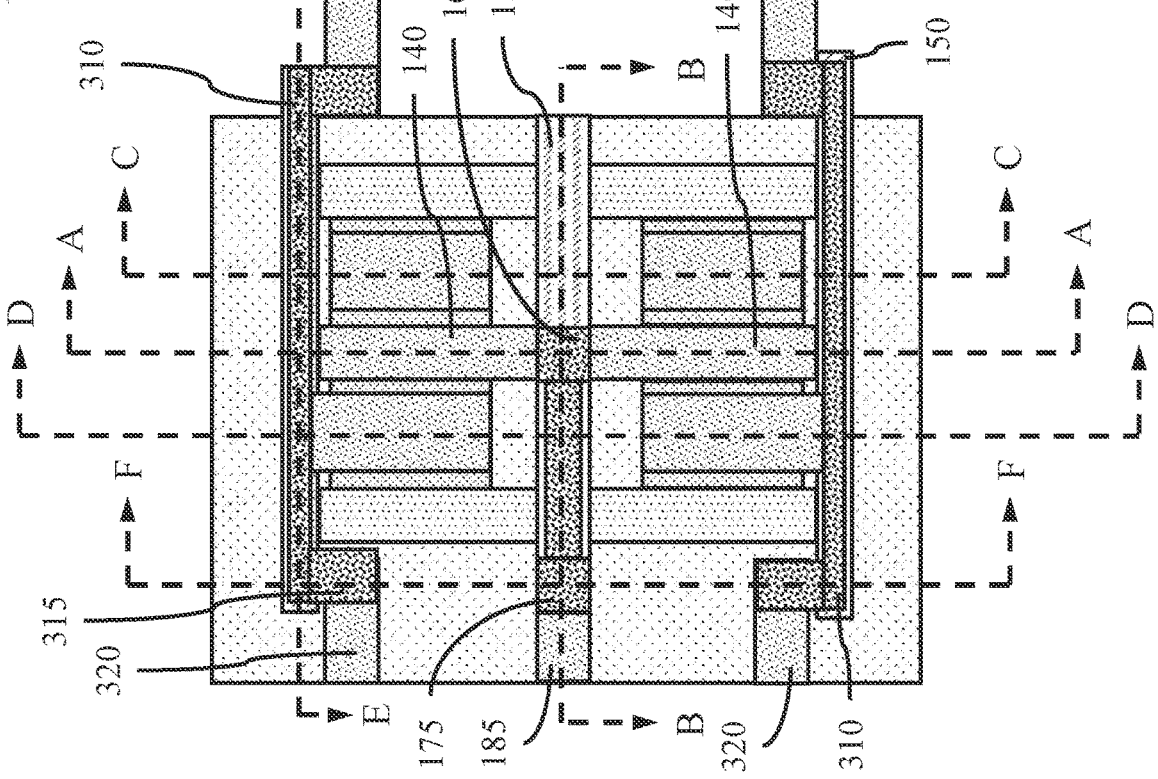

FIG. 7 is a top view with EE and FF cross-sectional views showing yet another embodiment of a semiconductor device, in accordance with an embodiment of the present invention.

The EE cross-section cuts through the conductive slab 310 and gate cut dielectrics 150 at opposite ends of the active gate structure 140, where the conductive slab 310 is within the gate cut dielectric 150.

In one or more embodiments, a conductive slab 310 can be formed in each of the gate cut dielectrics 150 by forming a gate cut trench, filling the gate cut trench with a dielectric material, removing a portion of the dielectric material to form a slab space, and filling the slab space with a conductive material, for example, a metal.

The FF cross-section cuts through the conductive slab 310 and gate cut dielectrics 150 perpendicular to the EE cross-section, and shows the indented power rail connections 315 and power rails 320 positioned closer to the gate interconnect via 167, offset stud 175, and the offset gate metal line 185, and the conductive slab 310 further from the gate interconnect via 167, offset stud 175, and the offset gate metal line 185.

In one or more embodiments, a conductive slab 310 can be formed in each of the gate cut dielectrics 150 by forming a gate cut trench, filling the gate cut trench with a dielectric material, removing a portion of the dielectric material to form a slab space, and filling the slab space with a conductive material, for example, a metal. The gate cut dielectrics 150 and conductive slabs 310 can be at opposite ends of the active gate structure 140.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates other vise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It wild be understood that the spatially relative teams are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that layer is referred to as being "between" two layers, it can be the only layer between the two layers, or one of more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A field effect device, comprising:
an active gate structure;
a gate contact structure within the active gate structure, wherein the gate contact structure is a same height as the active gate structure; and
a gate cut dielectric on opposite sides of the gate contact structure and active gate structure.

2. The field effect device of claim 1, wherein the gate contact structure includes two or more layers of conductive materials.

3. The field effect device of claim 2, wherein a first conductive layer of the two or more layers is a conductive material different from a conductive gate fill material of the active gate structure.

4. The field effect device of claim 1, further comprising a buried interconnect in electrical communication with the gate contact structure, wherein the buried interconnect is between a bottom surface of the active gate structure and dielectric material.

5. The field effect device of claim 4, further comprising an offset gate metal line in electrical communication with the gate contact structure through the buried interconnect and a gate interconnect via.

6. The field effect device of claim 1, further comprising a conductive slab in each of a gate cut dielectric at opposite ends of the active gate structure.

7. The field effect device of claim 6, further comprising a power rail adjacent to each of the conductive slabs, wherein a first power rail stud is electrically connected to one of the power rails, and a second power rail stud is electrically connected to the other of the power rails.

8. The field effect device of claim 7, further comprising a source/drain stud electrically connected between one of the power rails and a source/drain on a first active semiconductor region of the field effect device.

9. The field effect device of claim 7, wherein the power rails are laterally offset from the conductive slabs, such that the power rails are closer to an offset gate metal line than the conductive slabs.

10. A field effect device, comprising:
at least one active semiconductor region;
a source/drain on each of the at least one active semiconductor region;
an active gate structure across the at least one active semiconductor region;
a gate contact within the active gate structure, wherein the gate contact is a same height as the active gate structure;

a gate cut dielectric at opposite ends of the active gate structure; and a dummy gate structure at each of opposite ends of the at least one active semiconductor region.

11. The field effect device of claim 10, further comprising an interconnect on the gate contact, and a gate metal line on the interconnect.

12. The field effect device of claim 10, further comprising a buried interconnect in electrical communication with the gate contact, wherein the buried interconnect is between a bottom surface of the active gate structure and a bottom surface of the gate cut dielectric.

13. The field effect device of claim 10, further comprising a conductive slab in each of the gate cut dielectrics.

14. The field effect device of claim 13, further comprising a power rail adjacent to each of the conductive slabs, wherein a first power rail stud is electrically connected to one of the power rails, and a second power rail stud is electrically connected to the other of the power rails.

15. The field effect device of claim 14, wherein the power rails are laterally offset from the conductive slabs, such that the power rails are closer to an offset gate metal line than the conductive slabs.

16. A field effect device, comprising:
at least one active semiconductor region;
a dielectric bottom spacer layer on a lower portion of the at least one active semiconductor region;
a source/drain on each of the at least one active semiconductor region;
a first source/drain contact on a first source/drain;
a second source/drain contact on a second source/drain;
an active gate structure on the dielectric bottom spacer layer and across the at least one active semiconductor region;
a gate contact within the active gate structure, wherein the gate contact is a same height as the active gate structure;
a gate cut dielectric at opposite ends of the active gate structure; and
a dummy gate structure at each of opposite ends of the at least one active semiconductor region.

17. The field effect device of claim 16, further comprising a buried interconnect in electrical communication with the gate contact, wherein the buried interconnect is between a bottom surface of the active gate structure and a bottom surface of the gate cut dielectric.

18. The field effect device of claim 17, further comprising a conductive slab in each of the gate cut dielectrics.

19. The field effect device of claim 18, further comprising a power rail adjacent to each of the conductive slabs, wherein a first power rail stud is electrically connected to one of the power rails, and a second power rail stud is electrically connected to the other of the power rails.

20. The field effect device of claim 19, wherein the power rails are laterally offset from the conductive slabs, such that the power rails are closer to an offset gate metal line than the conductive slabs.

* * * * *